United States Patent [19]

Bullock

[11] 4,040,019

[45] Aug. 2, 1977

[54] ION IMPLANTED MAGNETIC BUBBLE MEMORY DEVICE HAVING MAJOR AND MINOR ROWS

[75] Inventor: David Carl Bullock, Richardson, Tex.

[73] Assignee: Texas Instruments Incorporated, Dallas, Tex.

[21] Appl. No.: 499,823

[22] Filed: Aug. 23, 1974

[51] Int. Cl.² ............................................. G11C 11/14
[52] U.S. Cl. ............................................. 340/174 TF
[58] Field of Search .................. 340/174 TF, 174 SR

[56] References Cited

U.S. PATENT DOCUMENTS

| | | | |
|---|---|---|---|
| 3,516,077 | 6/1970 | Bobeck et al. | 340/174 TF |
| 3,613,056 | 10/1971 | Bobeck et al. | 340/174 TF |
| 3,792,452 | 2/1974 | Dixon et al. | 340/174 TF |
| 3,824,568 | 7/1974 | Fischer et al. | 340/174 TF |
| 3,828,329 | 8/1974 | Fischer et al. | 340/174 TF |
| 3,967,002 | 6/1976 | Almasi et al. | 340/174 TF |
| B 455,425 | 2/1976 | Lin et al. | 340/174 TF |

*Primary Examiner*—James W. Moffitt
*Attorney, Agent, or Firm*—Harold Levine; James T. Comfort; William E. Hiller

[57] ABSTRACT

A magnetic bubble domain memory device employing a major row of contiguous regions for major loop bubble travel and a plurality of minor rows of contiguous regions for minor loop bubble travel, wherein the remainder of the magnetic domain-supporting layer in which the respective major and minor rows are provided includes ion-implanted regions. The edges of the ion-implanted regions adjacent the major and minor rows form rails to which magnetic bubble domains adhere and along which they may be propagated. The end region of each minor row is preferably positioned abreast a cusp between regions in the major row to effect zero degree phase transfer. Thin metallic loops are used for bubble generation and annihilation and, with respect to a Permalloy expansion detector, for replication. Metal masking improves the reliability of the boundaries between the non-implanted regions and the ion-implanted regions, especially with respect to the definition of the cusps between adjacent non-implanted regions in a row.

9 Claims, 12 Drawing Figures

FIG.10
FIG.11
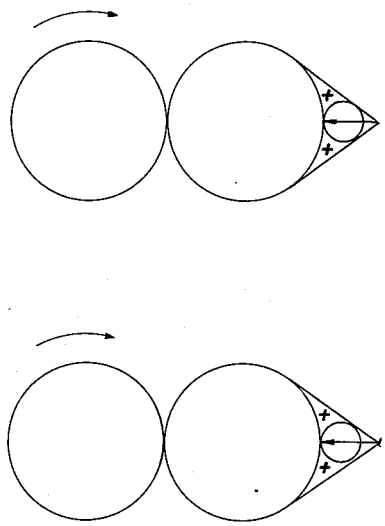
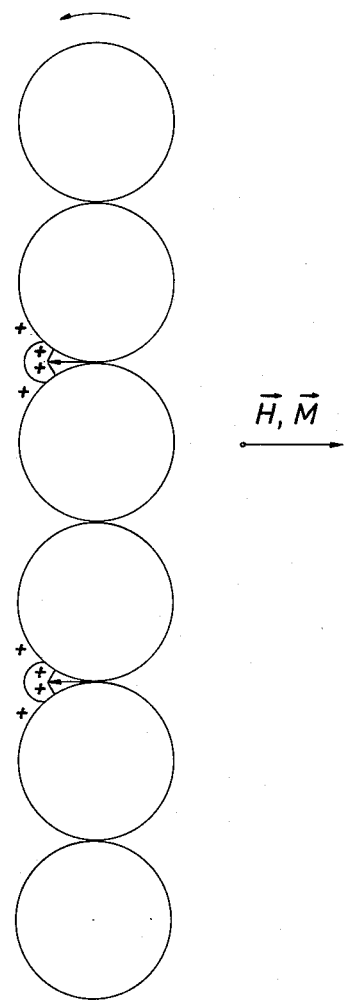
$\vec{H}, \vec{M}$
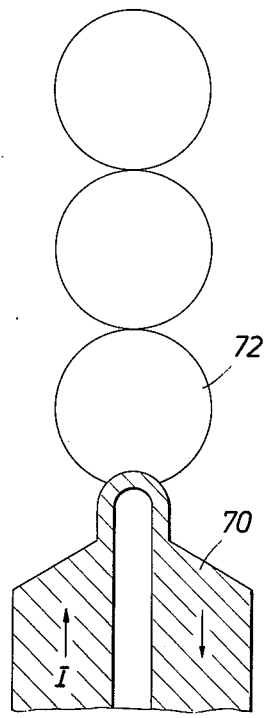
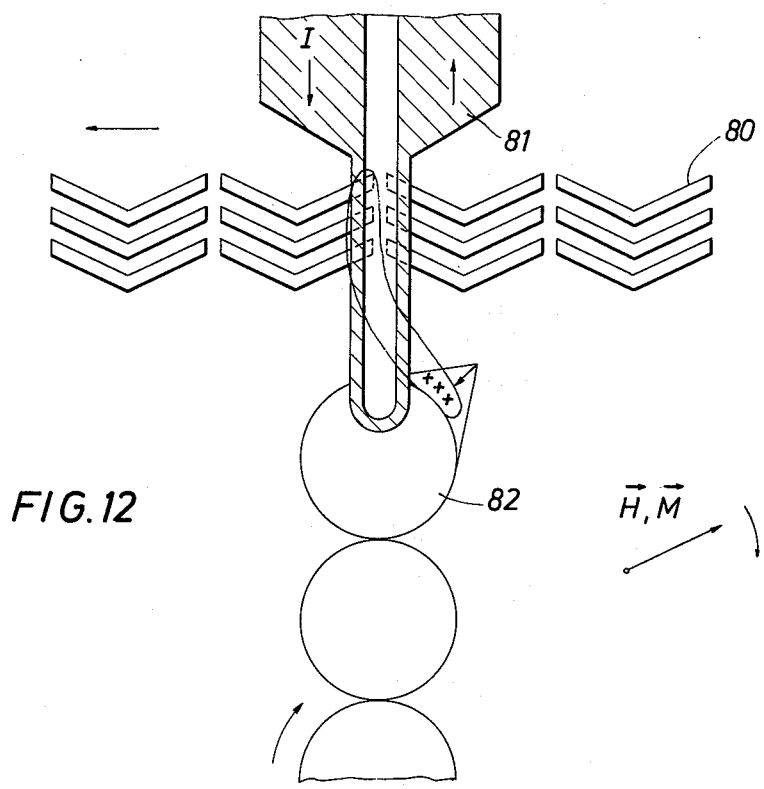
FIG.12
$\vec{H}, \vec{M}$

ION IMPLANTED MAGNETIC BUBBLE MEMORY DEVICE HAVING MAJOR AND MINOR ROWS

BACKGROUND OF THE INVENTION

1. Field of the Invention

This invention pertains to magnetic cylindrical (bubble) memory devices and more particularly to a more closely packed arrangement of such devices, means of fabrication of such arrangement and means for manipulating and otherwise handling of such an arrangement.

2. Description of Prior Art

The term "bubble" sometimes referred to as a "single wall domain," refers to a magnetic region encompassed by a single domain wall which closes on itself in the plane of the material in which the domain is moved. Inasmuch as a domain is selfcontained in the plane of the material and does not intersect the edge of the material, it is free to move in that plane in response to consecutively offset fields. A domain of this type is described in the Bell System Technical Journal (BSTJ), Vol. XLVI, No. 8, (1967) at page 1901.

The fields which move single wall domains are typically generated by pulses in series-connected conductor loop sets. The sets are pulsed in sequence to generate repetitive field patterns for moving information-representative domain patterns. Individual conductors can be pulsed also in a programmed manner to effect data processing functions between selected domains. A conductor arrangement of this type requires a number of external connections which are, preferably, kept to a minimum.

An alternate implementation for generating the field patterns for moving domains employs magnetically soft overlay patterns of Permalloy material which generate magnetic poles in response to fields in the plane of the material. The in-plane field is reoriented causing movement of the poles and, consequently, movement of the domains which are attracted by them. A pattern employing the popular T and bar shaped Permalloy overlay elements is described in U.S. Pat. No. 3,613,058, among others. Chevron shaped elements are described in U.S. Pat. No. 3,729,726 among others.

The more popular of the two systems just described is the T and bar shaped arrangement, which allows bubbles to be propagated in either direction therealong in accordance with inplane field direction. Although generally acceptable, some difficulty with the T and bar shaped Permalloy organizations have been observed. The major difficulty observed is caused by the gaps or the spacing between the soft magnetic elements. The narrower the gaps the better the circuit operates. But, the quality control problem achieving uniform and narrow gaps is extremely serious. A second problem is caused by the corners of such Permalloy circuits. To conserve space, the loops are elongated and include sharp double back curves or corners. Although such arrangements work satisfactorily in many relatively low frequency applications, they have proven unsatisfactory at higher frequencies and higher bit densities.

An alternate means to the Permalloy propagation patterns of defining a path along which bubbles are sustained and can be moved has been developed and is known as the localized ion implantation technique. Such implantation through a patterned photoresist mask may be used to alter the magnetic anisotropy of magnetic garnets and to thereby produce rails which guide bubbles in garnet epitaxial films.

The patterns established for magnetic memory organizations using the ion implanted garnet technique have followed the well known pattern of the Permalloy arrangements. One popular family for Permalloy circuits is the major-minor loop pattern shown, for example, in U.S. Pat. Nos. 3,613,056; 3,618,054 and 3,729,726 among others. In such an organization, read and write connections are made to the major loop and data bubbles are exchanged from the minor loops and the major loop at transfer gates, where the loops come into close proximity with one another. The advantage of such an organization is that the magnetic rotating fields do not have to be reversed since all data is confined within continuous loops that provide a circulating data path. An analogy may be made to a magnetic rotating drum that carries the data again and again past the same point for data reading and writing.

Hybrid arrangements of the major-minor loops configuration, such as shown in U.S. Pat. No. 3,613,058, have continuous minor loops, but a single path to the read and write circuitry. Such organization or arrangement lends simplicity and short access to the stored data, but requires in-plane magnetic field rotation reversals, and has not had wide spread acceptance.

Ion implanted garnet circuits following the organizations of the Permalloy circuits have heretofore taken up large amounts of area on a chip. That is, the major and minor loops in the arrangement just described have heretofore been formed by stringing the non-implanted circles one after another until the string closes on itself. When it is remembered that the domain or bubble size is only a fraction of the non-implanted circular areas forming the path, it may be seen that even one loop takes up considerable space. Further, using conventional photoresist masking techniques, the masked circular areas tend to be ill-defined at their cusps, that is, at the junction points between the circular areas, as contrasted to the regions exposed to ion implantation and comprising the remainder of the surface structure of the magnetic garnet layer. Each loop of non-implanted circles is elongated and although both inside and outside surfaces of the loops are theoretically suitable for travel of the domains, only travel on the outside has been satisfactory. This is because only at the outside is loop-to-loop transfer permitted without external wiring. Moreover, outside travel is used to prevent unwanted across-the-loop transfer, since to conserve space the distance across the loop is kept quite short.

Finally, it has been thought heretofore that loop-to-loop transfer, that is, between the minor loops and the major loop, had to take place where the loops were closest to each other. This is true of the transfer gate of a T-bar Permalloy circuit. However, one shortcoming of an ion implanted garnet circuit major-minor loop arrangement has been that if the circular non-implanted area of a minor loop is directly abreast of one of the circular areas of the major loop, then at the instant when the propagating field at the edge of the minor loop is suitable to release the bubble, the field of the major loop is not of the correct phase to receive the bubble. It has been necessary, therefore to retain the bubble at the end of the minor loop for one-half of the clock period until the phase of the field at the major loop is correct to accept the bubble, a very unhandy operating phenomenon.

Therefore, it is one feature of the present invention to provide an improved embodiment of an ion-implanted garnet, major-minor loop arrangement in which the non-implanted areas are formed in rows.

Another feature of the present invention is to provide an improved embodiment of an non-implanted magnetic bubble memory device employing ion non-implanted areas comprising major and minor rows in an otherwise ion-implanted magnetic garnet that provide transfer of bubbles from row to row wherein the releasing row and receiving row are offset to permit bubble release and acceptance operating at the same phase of the propagating field.

Yet another feature of the present invention is to provide an improved method of masking an organization to provide contiguous, circular non-implanted areas in an otherwise ion-implanted garnet so that the cusps formed between the circular non-implanted areas are sharply defined, thereby providing trouble-free high speed data propagation.

Still another feature of the present invention is to provide improved means of bubble generation, replication and annihilation in conjunction with an ion-implanted magnetic bubble memory device having a major-minor loop arrangement in which the non-implanted areas are formed in rows.

SUMMARY OF THE INVENTION

A preferred embodiment of the present invention comprises a bubble domain, major-minor organization formed with respect to an ion implanted garnet film. The regions which are masked during ion implantation are substantially circular and are contiguously grouped in rows to provide non-implanted regions adjacent to the ion-implanted regions comprising the remainder of the garnet film surface. The edges of the ion-implanted regions adjacent to the non-implanted regions form rails to which the bubble data domains adhere and along which they are propagated. The minor rows of non-implanted regions are preferably positioned so that the end regions thereof are aligned opposite cusps in the major row. In this position, the rotating in-plane magnetic field properly aligns the bubbles for release and access with appropriate clock pulsing means without having to hold a bubble for a 180° phase rotation of the field.

A conducting loop in contact with a non-implanted region may be used for bubble generation and annihilation with appropriate current pulsing. Also, a similar loop may be used as a replicator in conjunction with a non-implanted region and an expansion detector comprising Permalloy elements.

Finally, the non-implanted regions are made to have sharply defined cusps and better defined edges when the masks used in their manufacture are a thin metal alloy, rather than photoresist. Regions made in this manner assure reliable high speed application.

BRIEF DESCRIPTION OF THE DRAWINGS

So that the manner in which the above-recited features, advantages and objects of the invention, as well as others which will become apparent, are attained and can be understood in detail, more particular description of the invention briefly summarized above may be had by reference to the embodiments thereof which are illustrated in the appended drawings, which drawings form a part of this specification. It is to be noted, however, that the appended drawings illustrate only typical embodiments of the invention and are therefore not to be considered limiting of its scope, for the invention may admit to other equally effective embodiments.

In the drawings:

FIG. 10 is a diagram of the transfer action of reverse domains from minor rows to a major row when the end regions of the minor rows are abreast cusps between two regions of the major row.

FIG. 11 is a diagram of a generator and annihilator in accordance with the present invention.

FIG. 12 is a diagram of a section of a Permalloy chevron propagation path leading to a Permalloy expansion detector and a replicator (not shown) in accordance with the present invention.

DESCRIPTION OF PREFERRED EMBODIMENTS

Localized ion implantation through patterned photoresist masks has been used to produce rails which guide domains or bubbles in magnetic garnet epitaxial films secured to non-magnetic garnet substrates. Implantation expands the lattice structure so that the implanted regions are in lateral compression. In magnetic garnets with negative magnetostriction, the shallow regions have stress-induced easy axes parallel to the film surface. Bubbles adhere to the edges of the implanted regions because of magnetostatic and magnetoelastic effects. The in-plane magnetization in the implanted regions can be rotated by an in-plane applied field, as with the Permalloy circuits in the prior art. Bubbles in the underlying garnet follow the moving poles at the edges of the implanted regions.

Figure 1:
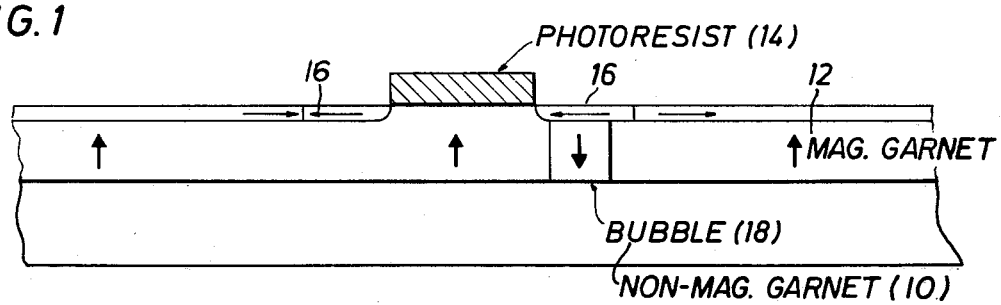
FIG. 1 is a cross-sectional view of a masked circular region and an ion implanted region adjacent thereto in accordance with the present invention.

Now referring to FIG. 1, an edge view of an implanted region and a non-implanted region adjacent thereto in accordance with the above description is illustrated. The non-magnetic garnet substrate 10 is overlayed with a magnetic garnet film 12 over which photoresist material 14 is used to define the circular regions to be masked while the remainder of the magnetic garnet film 12 is subjected to ion implantation. One successful masking material has been a Waycoat resist which is 12,000 A thick. Implanting is done, for example, with $2 \times 10^{16}$ protons/cm$^2$ of 100 keV energy. Thus, the area 16 outside of the circular photoresist element 14 is implanted. Bubbles are propagated in the ion implanted circuit owing to the presence of magnetic poles which are caused by the discontinuity in the transverse component of the magnetization junction between the implanted and unimplanted regions. The in-plane magnetization in the implanted region can be rotated by an in-plane applied field, as with the prior art Permalloy circuits. Bubbles 18 in the underlying garnets follow the moving poles at the edges of the implanted regions. Thus, the non-implanted region defined in the implanted layer take the place of the superimposed Permalloy pattern wherein the edges of the ion-implanted regions adjacent to the non-implanted regions form rails along which the bubbles may be propagated. Propagation of 5 micrometer diameter bubbles at a rate of 100 kHz has been achieved in a magnetic garnet film of the following composition: $(YGdTm)_3(FeGa)_5O_{12}$.

Figure 2:
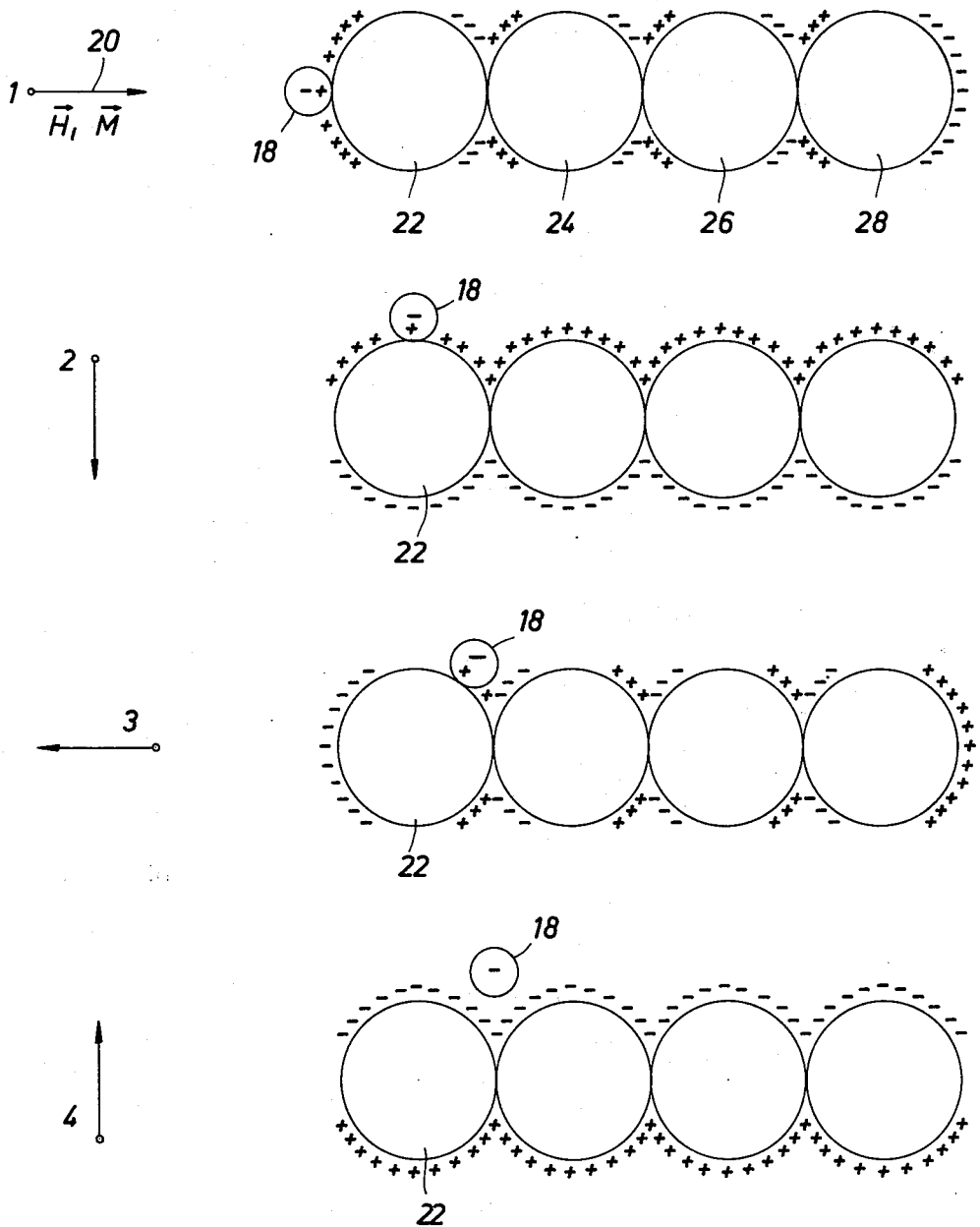
FIG. 2 is a diagram illustrating a simplified model of bubble propagation with respect to non-implanted regions.

To understand how a bubble propagates along a row of contiguous circular regions, reference is made to FIG. 2, wherein is illustrated an examination of a few possible cases for the magnetic pole distribution at the boundaries. The simplest case is to assume that the in-plane drive field completely saturates the magnetization in the implanted layer. Assume that bubble 18 is attracted to the positive head 20 of the vector representing the drive field. The model illustrated starts with bubble 18 at the left end of the row of four circles 22, 24, 26 and 28. Rotating drive field 20 is successively positioned in the four related diagrams to the right, straight down, to the left, and straight up, respectively. For the first three clock phases, the bubble follows the positive pole distribution properly. However, at the fourth position, in the cusp between circles, it is subjected to a negative pole distribution, which will repel it away from the propagating track or rail. Hence, the pole distribution as shown is not completely adequate to explain propagation of magnetic bubbles.

Figure 3:
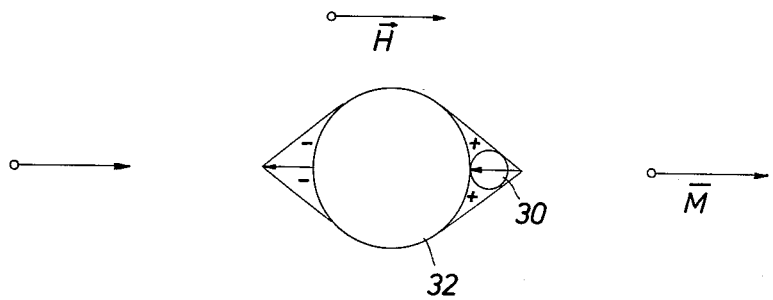
FIG. 3 is a diagrammatic representation of a reverse domain in the implanted layer at the edges of a non-implanted region.
Figure 4:
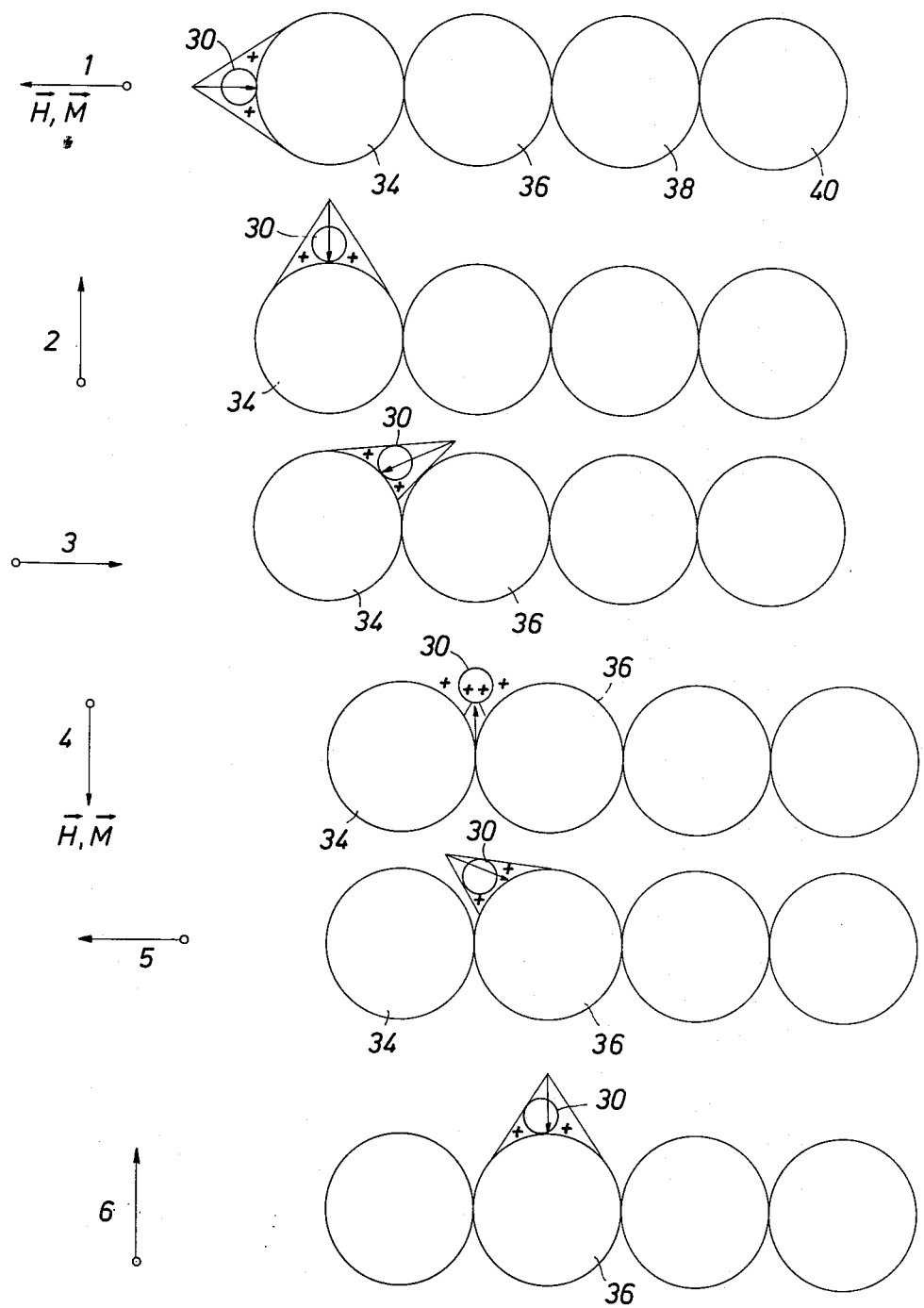
FIG. 4 is a diagram illustrating a model of bubble propagation with respect to non-implanted regions using the reverse domain theory.

Now referring to FIG. 3, a diagrammatic representation of reverse domains in the implanted layer at the edges of an implanted region is illustrated. This reverse domain theory has been postulated to explain the fact that the bubble propagating around the circles is actually of a polarity opposite to that expected from the uniformly magnetized implanted layer of FIG. 3. Now referring to FIG. 4, a diagram illustrating bubble propagation with respect to rows of non-implanted regions using the reverse domain theory is illustrated. It is postulated that during steps 1 and 2, the reverse domain follows in phase with the rotation of the in-plane drive field. In steps 3, 4 and 5, however, the position and extent of the reverse domain is different from what it would be with an isolated circle. The most critical point is shown in step 4 where the closure domain contracts far into the cusp between the circles. This allows positive poles to be induced on the sides of the cusps and causes the bubble to be held tightly, rather than repelled. There is still a slight repulsive interaction of the bubble due to the reverse domain as the bubble traverses the cusp. However, the model illustrated appears to be adequate to explain the results of the magnetostatic, magnetoelastic and exchange interactions of a bubble traversing the track or rail formed by the edges of the ion-implanted regions adjacent to a row of contiguous non-implanted regions.

Figure 5:
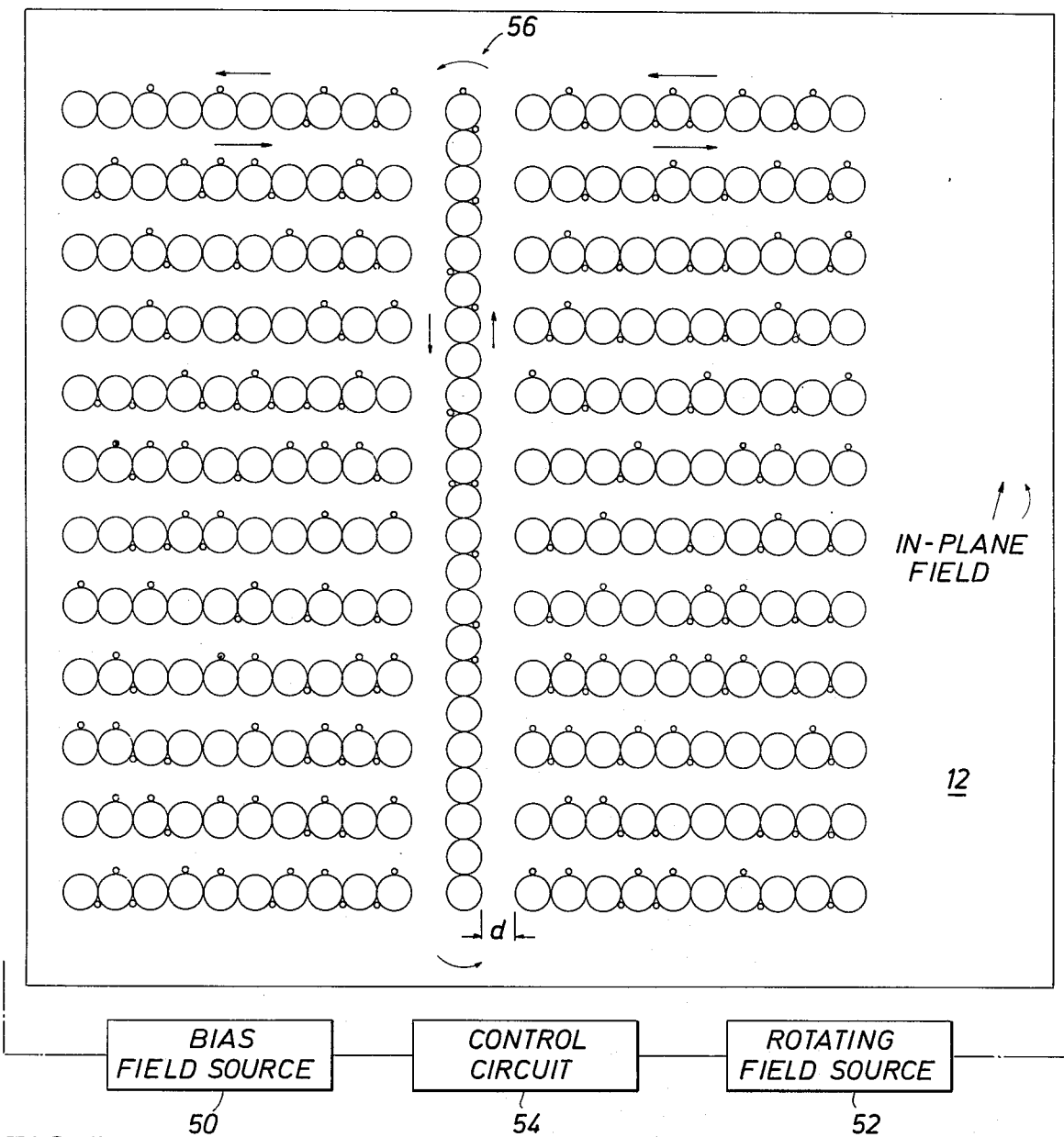
FIG. 5 is a plan view of a major-minor bubble memory organization in accordance with a preferred embodiment of the present invention using ion implanted garnet film.

Now referring to FIG. 5, a plan view is shown of a major-minor mobile memory organization in accordance with a preferred embodiment of the present invention using ion implanted magnetic garnet film 12, as described above. The arrangement shows a layer of magnetic garnet epitaxial film 12 in which single wall domains are supported and caused to be propagated with respect to rows of contiguous non-implanted regions, with the remainder of the magnetic garnet epitaxial film 12 being ion-implanted. A bias field supplied by source 50 maintains single wall domains in the material at nominal operating size, as is well known. Rotating field source 52 causes movement of the domains to occur, normally counterclockwise. The rotating field source 52 is under the control of a control circuit 54 for activation and synchronization.

The bias sources, control circuit and other auxiliary circuits (such as pulsing circuits for application to the transfer gates, counter circuits for tracking the bubbles along their propagating rows, etc.) are well known. Although not specifically illustrated in each case, such circuits may be used with the illustrated embodiment.

The organization illustrated in FIG. 5 includes a major row 56 of non-implanted regions substantially circular in configuration and contiguously grouped. Similarly, a plurality of minor rows, which may be considered identical to one another, are similarly comprised of non-implanted regions that are circular in nature and contiguously grouped in rows. The minor rows are positioned on either side of major row 56 and are preferably at right angles to the major row.

Figure 6:
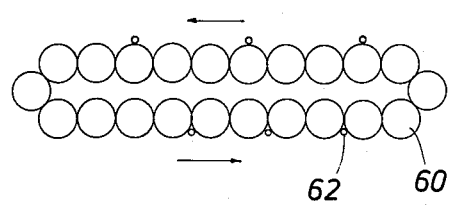
FIG. 6 is a simplified diagram of a prior art memory loop using ion implanted garnet film with non-implanted regions arranged in a loop.
Figure 7:
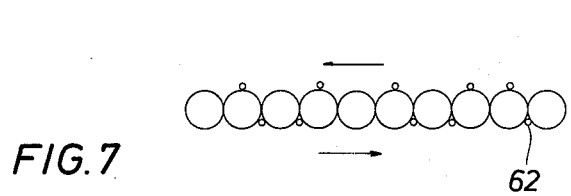
FIG. 7 is a simplified diagram of a row of non-implanted regions as employed in the present invention.

Before describing the operation of the organization illustrated in FIG. 5, attention should now be given to FIGS. 6 and 7, which are simplified drawings. A prior art structure is illustrated in FIG. 6 and the basic row structure of the FIG. 5 embodiment is shown in FIG. 7. In the FIG. 6 embodiment, circular non-implanted regions 60 are arranged in a loop on an otherwise ion-implanted magnetic garnet film similar to the major-minor loop arrangements employing Permalloy circuits, as disclosed in the prior art. Bubbles 62 travel along the outside edge of the loop formed by such regions from cusp to circular edge, to cusp, in the manner described for FIG. 4. At the illustrated time, it may be seen that the bubbles are in the cusps on the bottom while on the outer peripheral edges of the circular regions at the top. As illustrated, the in-plane field is in an upward direction.

In the embodiment of the row shown in FIG. 7, a single row of non-implanted regions permits bubbles 62 to travel in loop fashion around the row and along the edge or rail defined by the edges of the ion implanted regions adjacent to the row of non-implanted regions. It has been discovered, that even at high speeds, bubbles do not separate from the edge of the regions at the end of the rows, as sometimes occurs with the T-bar Permalloy circuits. Further, it has been discovered that the rows act in every other regard equal in operation to the loop arrangement defined in FIG. 6, when arranged in a minor-major loop organization, such as illustrated in FIG. 5. The compactness of the data, as well as a reduction in the number of non-implanted regions, is readily apparent. Notice that FIG. 7-type rows are used for both the major track and the minor tracks.

Figure 8:
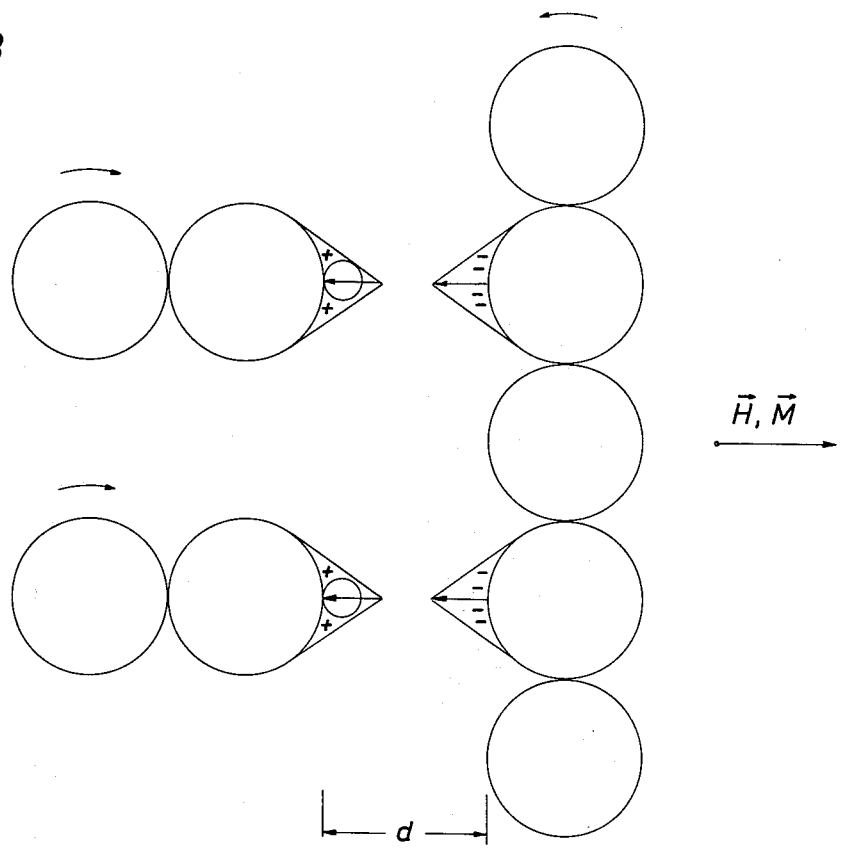
FIG. 8 is a partial diagram of a transfer of reverse domains from minor rows to a major row when the end regions of the minor rows are abreast regions of the major row.
Figure 9:
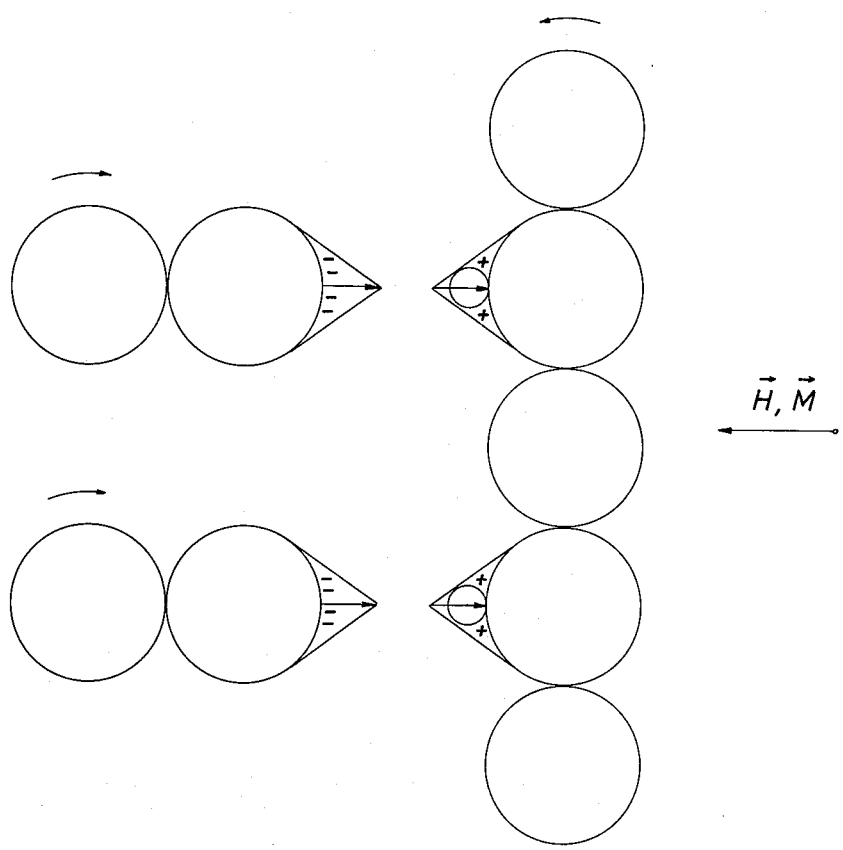
FIG. 9 is a partial diagram of the transfer action illustrated in FIG. 8 with the in-plane field located 180° from the position shown in FIG. 8.

To obtain optimum access time in the transfer gate between the major and minor rows, it has been discovered that the end region of each minor row should be positioned opposite a cusp in the major row. When the end region of a minor row is positioned abreast a region in the major row, the action of transfer is as illustrated in FIGS. 8 and 9. In the abreast arrangement, transfer from the minor rows to the major row is effected by both blocking the magnetic poles of the circles at the ends of the minor rows and lowering of the bias field in the transfer region, denoted by $d$. To transfer from the major row into the minor rows, the magnetic poles on the sides of the major row adjacent to the minor rows are blocked. Blocking is effected by a suitably shaped current carrying conductor. For this type of transfer, the number of clock cycles to propagate a bubble completely around the major row must be an integral multiple minus one of the number of clock cycles necessary to propagate a bubble around a minor row. This condition may be achieved by slightly increasing the radius of the circles on one side of the major row in order to reduce the total number of circles in the major row.

In FIG. 8, the reverse domain at the end region of the minor row is positioned and ready for release to the major row; however, the region in the major row is of the opposite polarity necessary for accepting the transfer. That is, the field at the edge of the major row is not of the correct phase to receive the bubble. It is necessary, therefore, to retain the bubble at the end of the minor row for one-half of a clock period until the phase of the field at the major row is correct to accept the bubble, as illustrated in FIG. 9. Transfer is possible, but the bubble must be held for a 180° phase rotation of the field, requiring a transfer pulse for reducing the bias field in the transfer region which must be carefully controlled with respect to duration.

Now referring to FIG. 10, a transfer arrangement is illustrated for a zero-degree phase loss gate. This occurs when the end region of a minor row is abreast the cusp between adjacent regions in the major row. In this arrangement, the number of bit positions in the major row is an integral multiple of the number of bit positions in a minor row.

Notice that for the FIG. 10 gate arrangement, attractive poles exist on both sides of the gate at the same point of the clock cycle and hence the bubble in the gate can be transferred across in either direction by a gradient pulse. The phase of the propagating field is simultaneously correct for releasing the bubble from the minor row and accepting it at the major row, or vice versa.

The basic functions necessary for manipulating a bubble memory system are generation, annihilation, transfer, replication and detection, all of which are used in connection with Permalloy circuits. Generation and annihilation of bubbles can be done on ion implanted circuits by conducting loops regardless of the presence or absence of Permalloy elements. Illustrated in FIG. 11 is a preferred embodiment of such a generator and annihilator. A loop 70 of thin metal is shown adjacent the edge of end region 72 of a row of non-implanted regions as previously described. The metallic loop reduces in dimension at the edge of region 72. Preferably, the conducting loop is an alloy having, among other characteristics, high condutivity, such as Ti-W-Au or Cu-Al, and is a structure approximately 0.5 micrometers thick. Current means (not shown) may be applied to loop 70 for domain generation by reversing the dc bias field within the loop 70 in the vicinity of the edge of region 72. Typically, to generate a bubble may require a current of approximately 200 milliamps in a suitably shaped conducting loop.

The structure shown in FIG. 11 may be used for annihilation by raising the dc field within the loop 70 by application of approximately 200 milliamperes of current when a bubble is within the confines of the conducting loop.

The function of replication is primarily required when an expansion detector that destroys the data is used. Hence, a chevron propagation path comprising Permalloy chevron elements 80 is illustrated in FIG. 12. This path may lead to an expansion detector (not shown). Replicator 81 is similar to the generator and annihilator shown in FIG. 11. It is preferably a thin loop, long enough to cover both the edge of end region 82 of the row of non-implanted regions with which the replicator is used, as well as adjoining elements of the expansion detector.

As shown in FIG. 12, a domain passing through the position along the edge of region 82 confined within the loop of replicator 81 is stretched by lowering the bias field within the loop to form a strip domain as the stretching pulse is applied and just before the domain is cut. The two chevrons that are covered by the conductor may be nonplanar. After the strip domain is cut, the domain reforms as a bubble and progresses down the chevron path to the expansion detector while the remaining other part of the strip domain remains in contact with the edge of region 82. Hence, the data is not destroyed by its detection and remains in the row. This technique makes it unnecessary to return a bubble to a row once it has been replicated.

As stated above with respect to the generator and annihilator in FIG. 11, a suitable current of 200 milliamps to replicator 81 is suitable for domain replication. Further, the replicator itself may be of the same thickness and material as the generator and annihilator illustrated in FIG. 11. The expansion detector has been described with respect to Permalloy chevron elements. Permalloy T and bar elements may also be employed and used in conjunction with replicator 81. In addition, detectors not using Permalloy elements at all may be employed with replicator 81.

Ion implanted magnetic bubble circuits have heretofore been fabricated through the use of a patterned photoresist mask. It has been difficult, however, to achieve suitable edge definition of the masked circular regions using this technique, particularly in the cusp area between adjacent circular egions. Therefore, it has been discovered that a patterned thin metallic layer employed as a mask achieves improved definition of the junctions between the non-implanted regions and the ion implanted regions and also produces a stress gradient at the metal edge which penetrates into the magnetic garnet and acts as an additional trapping force for keeping the bubble on track. One suitable metal layer has been a layer approximately 0.75 micron thick made of an alloy of Ti-W-Au.

While particular embodiments of the invention have been shown, it will be understood that the invention is not limited thereto, since many modifications may be made and will become apparent to those skilled in the art.

What is claimed is:

1. A magnetic bubble domain memory comprising:
   a substrate,
   a body of magnetic material capable of supporting magnetic bubble domains disposed on said substrate, the upper surface portion of said domain-supporting magnetic body having a pattern formed therein defined by regions of two different types, the first of said regions being of the same character as the remainder of said domain-supporting magnetic body, the second of said regions being ion-implanted regions the edges of which adjacent to said first regions form rails to which magnetic bubble domains in the remainder of said domain-supporting magnetic body adhere and along which the magnetic bubble domains may be propagated, one of said first and second regions forming a major row of contiguous regions in the upper surface portion of said domain-supporting magnetic body, said major row having adjacent regions contacting each other and terminating at its opposite ends in respective end regions, said one of said first and second regions also forming a plurality of minor rows of contiguous regions in the upper surface portion of said domain-supporting magnetic body, each of said minor rows having adjacent regions contacting each other and terminating at its opposite ends in respective end regions, said major row being arranged in spaced relationship to said plurality of minor rows and in alignment with the end regions of each of the respective minor rows for transfer of bubble domains between the major row and each of the minor rows, and means operably coupled to said domain-supporting magnetic body for controllably positioning and moving magnetic bubble domains with respect to said major and minor rows.

2. A magnetic bubble domain memory as set forth in claim 1, wherein said means for controllably positioning and moving magnetic bubble domains includes a d.c. bias field, and clocking means for holding a bubble domain to be transferrably released for a time until the bias field for the accepting region is biased for acceptance.

3. A magnetic bubble domain memory as set forth in claim 1, wherein said one of said first and second regions is the first of said regions.

4. A magnetic bubble domain memory as set forth in claim 3, wherein the contiguous regions of said major row and of each of said minor rows are respectively circular in configuration.

5. A magnetic bubble domain memory as set forth in claim 4, wherein said plurality of minor rows of contiguous regions comprises two groups of minor rows with the minor rows included in each respective group being in parallel relationship with respect to each other, and said major row of contiguous regions being interposed between the two groups of minor rows of contiguous regions in spaced perpendicular relationship thereto.

6. A magnetic bubble domain memory as set forth in claim 4, wherein a region of said major row is aligned for bubble domain transfer abreast an end region of a minor row.

7. A magnetic bubble domain memory as set forth in claim 3, wherein the contiguous regions of said major row and of each of said minor rows are of circular configuration, adjoining regions in each of said major and minor rows defining a cusp area therebetween of the other of said first and second regions.

8. A magnetic bubble domain memory as set forth in claim 7, wherein the respective cusp areas provided between adjacent regions of said major row of contiguous regions are aligned with end regions of minor rows of contiguous regions so as to be abreast thereof for bubble domain transfer between major and minor rows.

9. A magnetic bubble domain memory as set forth in claim 8, wherein the number of bit positions in said major row is an integral multiple of the number of bit positions in a minor row.

* * * * *